(12) United States Patent
Lee

(10) Patent No.: US 12,021,071 B2
(45) Date of Patent: Jun. 25, 2024

(54) DISPLAY APPARATUS USING SEMICONDUCTOR LIGHT-EMITTING DEVICE

(71) Applicant: LG ELECTRONICS INC., Seoul (KR)

(72) Inventor: Yonghan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/004,646

(22) PCT Filed: Jul. 8, 2020

(86) PCT No.: PCT/KR2020/008934
§ 371 (c)(1),
(2) Date: Jan. 6, 2023

(87) PCT Pub. No.: WO2022/010008
PCT Pub. Date: Jan. 13, 2022

(65) Prior Publication Data
US 2023/0253386 A1 Aug. 10, 2023

(51) Int. Cl.
*G09G 3/32* (2016.01)
*H01L 25/16* (2023.01)
(Continued)

(52) U.S. Cl.
CPC ............ *H01L 25/167* (2013.01); *G09G 3/32* (2013.01); *H01L 33/62* (2013.01); *G09G 2300/0426* (2013.01); *G09G 2300/06* (2013.01)

(58) Field of Classification Search
CPC ... H01L 25/167; H01L 33/62; H01L 25/0753; H01L 27/12; H01L 27/156; H01L 33/36;
(Continued)

(56) References Cited

U.S. PATENT DOCUMENTS

| 2009/0066636 A1* | 3/2009 | Kim ...................... G09G 3/344 345/55 |
| 2019/0147793 A1 | 5/2019 | Valentine |

(Continued)

FOREIGN PATENT DOCUMENTS

| KR | 101845907 | 4/2018 |
| KR | 1020200039900 | 4/2020 |

OTHER PUBLICATIONS

PCT International Application No. PCT/KR2020/008934, Written Opinion and International Search Report dated Apr. 7, 2021, 15 pages.

*Primary Examiner* — Antonio Xavier
(74) *Attorney, Agent, or Firm* — LEE, HONG, DEGERMAN, KANG & WAIMEY

(57) ABSTRACT

The present disclosure relates to a display apparatus using a semiconductor light-emitting device, the display apparatus comprising: a base substrate; a row driver which provides 3-state first signals including a high, a ground, and a low signal; a column driver which provides 2-state second signals including a high and a low signal; and a plurality of semiconductor light-emitting devices provided on the base substrate, wherein the plurality of semiconductor light-emitting devices include a first semiconductor light-emitting device and a second semiconductor light-emitting device which are connected to the row driver and the column driver in different pole directions.

20 Claims, 20 Drawing Sheets

(51) Int. Cl.
*H01L 27/15* (2006.01)
*H01L 33/62* (2010.01)

(58) Field of Classification Search
CPC .................. H01L 33/486; G09G 3/32; G09G 2300/0426; G09G 2300/06; G09G 3/3216; G09F 9/33
See application file for complete search history.

(56) References Cited

U.S. PATENT DOCUMENTS

| | | |
|---|---|---|
| 2019/0289687 A1 | 9/2019 | Wu et al. |
| 2019/0340972 A1 | 11/2019 | Hao et al. |
| 2019/0347994 A1* | 11/2019 | Lin .......................... G09G 3/32 |

* cited by examiner

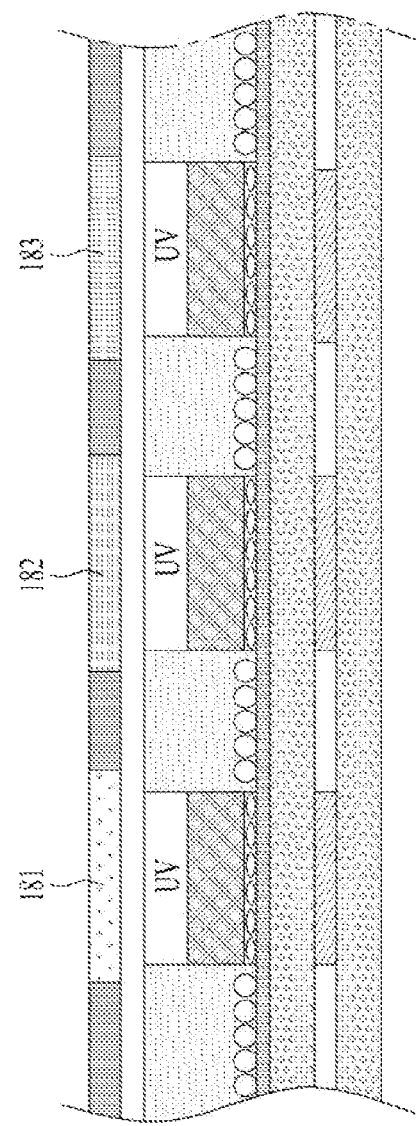

DISPLAY APPARATUS USING SEMICONDUCTOR LIGHT-EMITTING DEVICE

CROSS-REFERENCE TO RELATED APPLICATION(S)

This application is the National Stage filing under 35 U.S.C. 371 of International Application No. PCT/KR2020/008934, filed on Jul. 8, 2020, the contents of which are all incorporated by reference herein in its entirety.

TECHNICAL FIELD

The present disclosure relates to a display device using a semiconductor light emitting element. Here, the semiconductor light emitting element may correspond to a micro-light emitting diode (LED). The present disclosure relates to a circuit configuration for driving a semiconductor light emitting element.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

To implement a display device using these semiconductor light emitting elements, a very large number of semiconductor light emitting elements are required. Therefore, considering manufacturing cost, the size of the individual semiconductor light emitting elements needs to be miniaturized to increase the number of semiconductor light emitting elements to be produced on a substrate of the same area.

Miniaturization of semiconductor light emitting elements causes difficulties in manufacturing driving substrates. For example, since the initial development cost (Non-recurring engineering (NRE)) for manufacturing a driving substrate is large, there is a problem that it is difficult to respond to various products such as small-type mass production, multi-type response production, and transparent/flexible production.

In addition, since a large screen has many pixel columns and rows, there is a problem in that the number of drivers providing signals corresponding to each column and row increases.

DISCLOSURE

Technical Problem

An objective of the present disclosure is to provide a display device using a semiconductor light emitting element.

An objective of an embodiment of the present disclosure is to easily respond to various display products using a modular interposer.

An objective of an embodiment of the present disclosure is to simplify a manufacturing process by manufacturing one modular interposer to correspond to a plurality of pixels and reducing the number of IC chips.

An objective of an embodiment of the present disclosure is to improve a process yield by reducing the number of column or row drivers.

Furthermore, another object of an embodiment of the present disclosure is to overcome various problems not mentioned herein. One of skilled in the art may understand the entire meaning of the specification and drawings.

Technical Solution

To achieve the above objective, a display device using a semiconductor light emitting element includes a base substrate, a row driver configured to provide a first signal of 3-state including high, ground, and low, a column driver configured to provide a second signal of 2-state including high and low, and a plurality of semiconductor light emitting elements provided on the base substrate, wherein the plurality of semiconductor light emitting elements include a first semiconductor light emitting element and a second semiconductor light emitting element that are connected to the row driver and the column driver in different polar directions.

According to an embodiment, the first semiconductor light emitting element may emit light with a first signal in a high state and a second signal in a low state, and the second semiconductor light emitting element may emit light with a first signal in a low state and a second signal in a high state According to an embodiment, the display device using the semiconductor light emitting element may include the first semiconductor light emitting element and the second semiconductor light emitting element that cross each other in a column direction.

According to an embodiment, the display device using the semiconductor light emitting element may include the row drivers in a number corresponding to half a number of rows formed by the plurality of semiconductor light emitting elements.

According to an embodiment, the display device using the semiconductor light emitting element may include the first semiconductor light emitting element and the second semiconductor light emitting element that cross each other in a row direction.

According to an embodiment, the display device using the semiconductor light emitting element may include the row drivers in a number corresponding to half a number of columns formed by the plurality of semiconductor light emitting elements.

According to an embodiment, the display device using the semiconductor light emitting element
may include a unit-module interposer including the first semiconductor light emitting element, the second semiconductor light emitting element, and an IC chip.

According to an embodiment, the base substrate may include a row line connected to the row driver and a column line connected to the column driver, and the interposer may be transferred to the base substrate to electrically connect the row line and the column line to the IC chip.

According to an embodiment, the IC chip may include a first pin configured to provide a signal received by the row driver, and a second pin configured to provide a signal received by the column driver, wherein the first semiconductor light emitting element includes a first electrode connected to the first pin and a second electrode connected to the second pin, and the second semiconductor light emitting element includes a first electrode connected to the second pin and a second electrode connected to the first pin.

According to an embodiment, the interposer may include a first semiconductor light emitting element set including the plurality of first semiconductor light emitting elements and a second semiconductor light emitting element set including the plurality of second semiconductor light emitting elements.

According to an embodiment, the first and second semiconductor light emitting elements may include semiconductor light emitting elements that emit red light, green light, and blue light, respectively.

According to an embodiment, the display device using the semiconductor light emitting element may perform passive matrix (PM) driving.

According to an embodiment, the row driver may sequentially provide high, ground, and low signals.

According to an embodiment, the row driver may provide a high signal in a first ½ frame and a low signal in a next ½ frame, or may provide a signal in a reverse order.

Advantageous Effects

An embodiment of the present disclosure may provide a provide a display device using a semiconductor light emitting element.

An embodiment of the present disclosure may respond to various display products using a modular interposer.

A manufacturing process may be simplified by manufacturing one modular interposer to correspond to a plurality of pixels and reducing the number of IC chips.

A process yield may be improved by reducing the number of column or row drivers.

Furthermore, according to another embodiment of the present disclosure, there are additional technical effects not mentioned here. One of skilled in the art may understand the entire meaning of the specification and drawings.

DESCRIPTION OF DRAWINGS

FIGS. 5A to 5C are conceptual diagrams illustrating various examples of color implementation with respect to a flip-chip type semiconductor light emitting element;

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
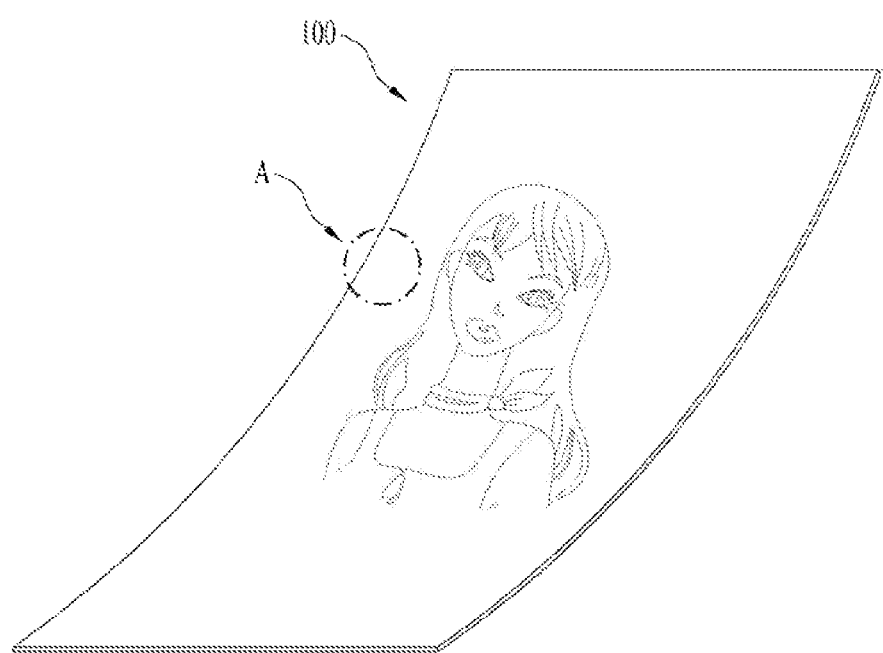
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
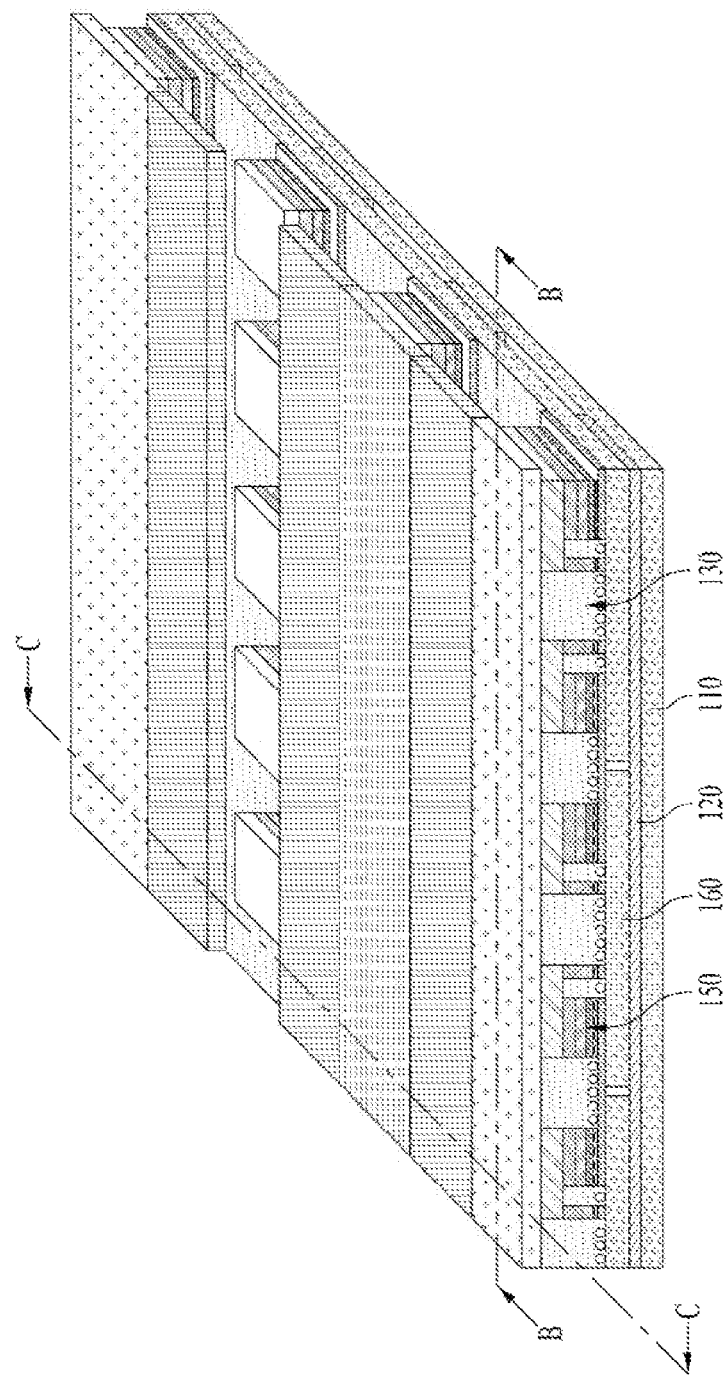
FIG. 2 is a partially enlarged diagram showing a part A shown in FIG. 1.

FIG. 2 is a partially enlarged view showing part A of FIG. 1.

Figure 3A:
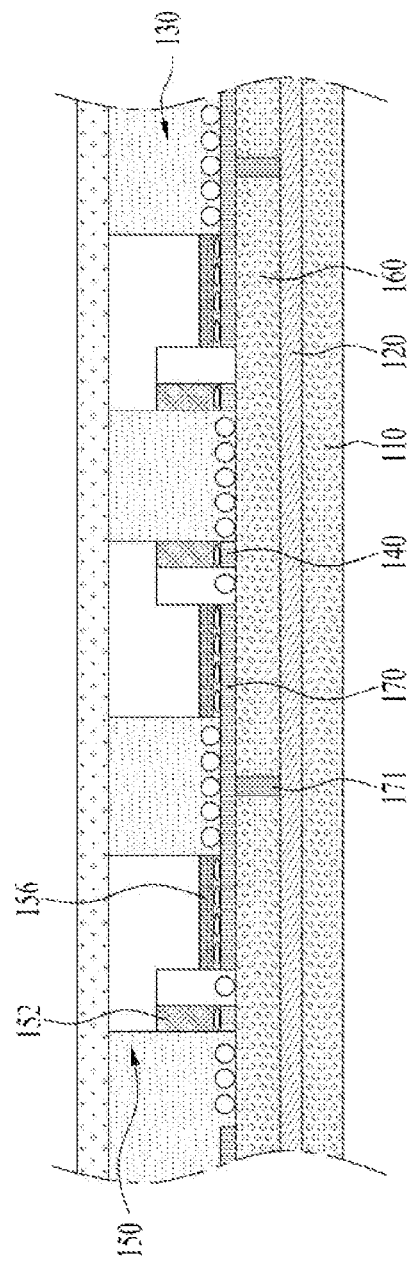
FIGS. 3A and 3B are cross-sectional diagrams taken along the cutting lines B-B and C-C in FIG. 2.
Figure 3B:
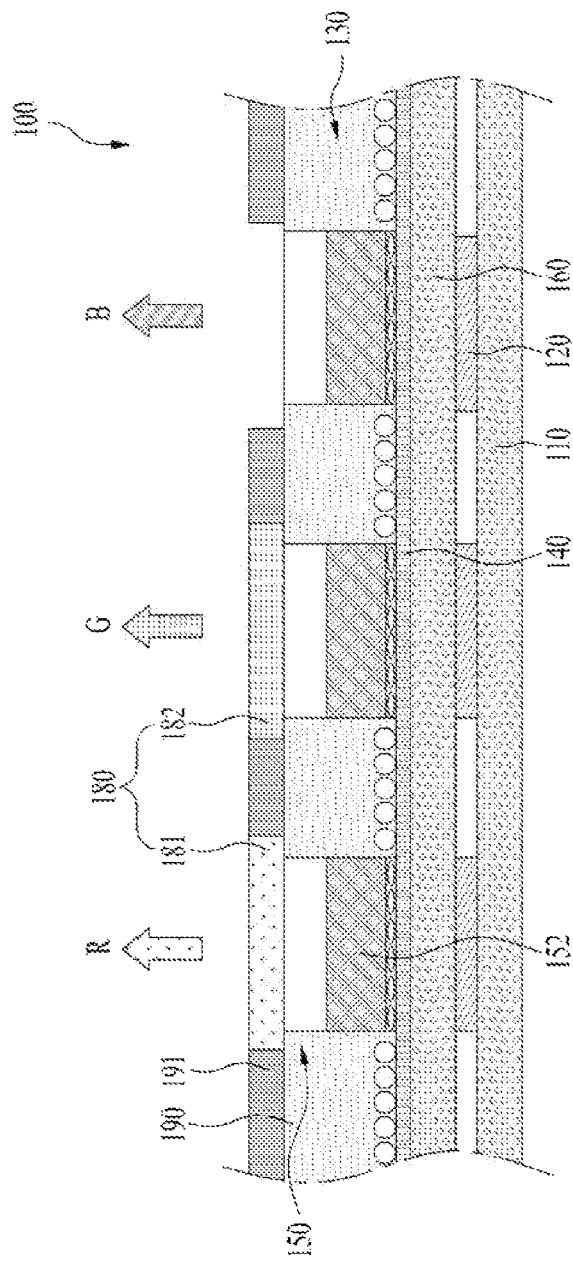

FIGS. 3A and 3B are cross-sectional views taken along lines B-B and C-C in FIG. 2.

Figure 4:
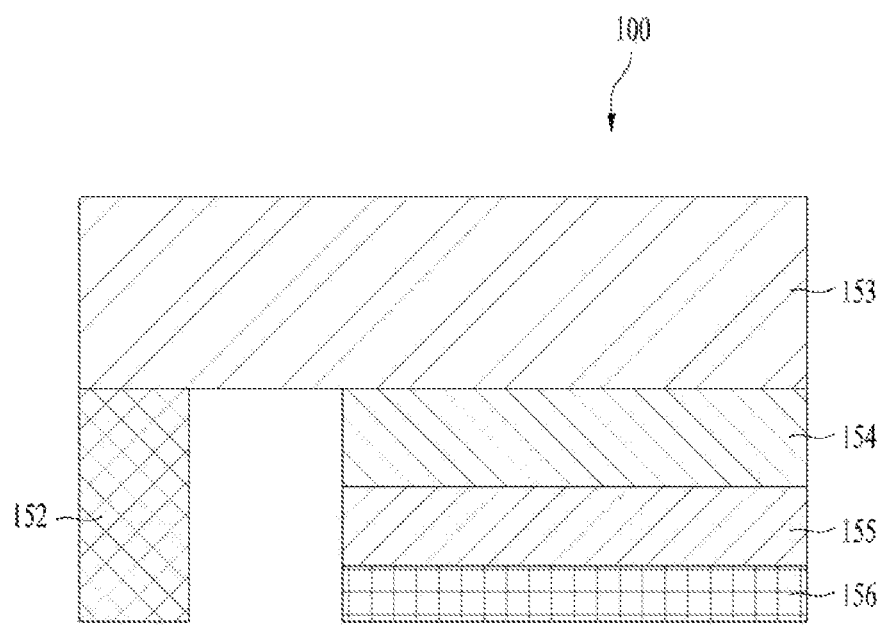
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
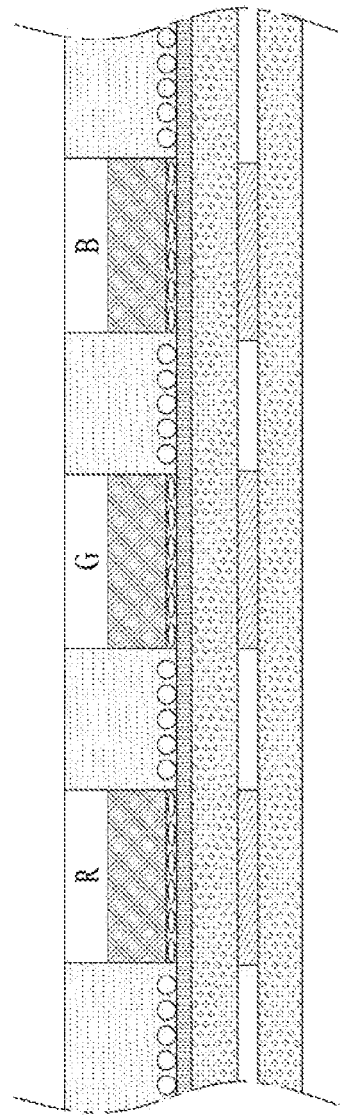
Figure 5B:
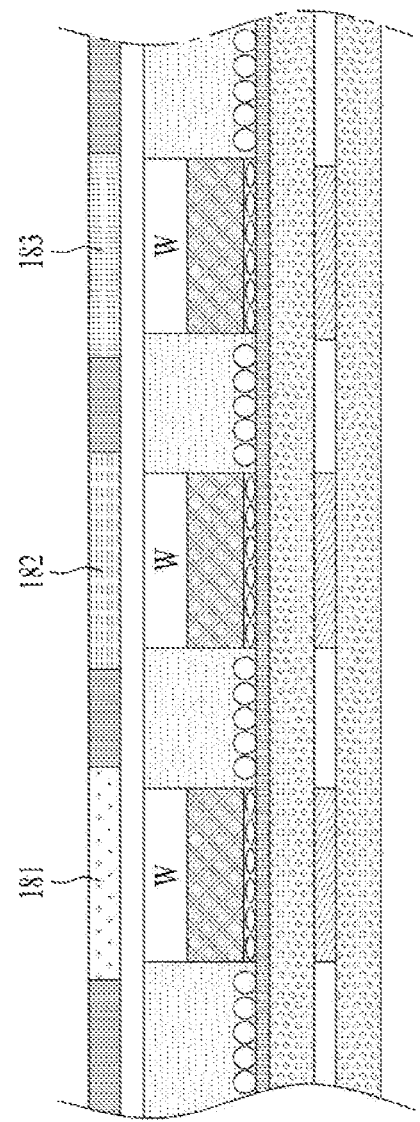

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm ×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
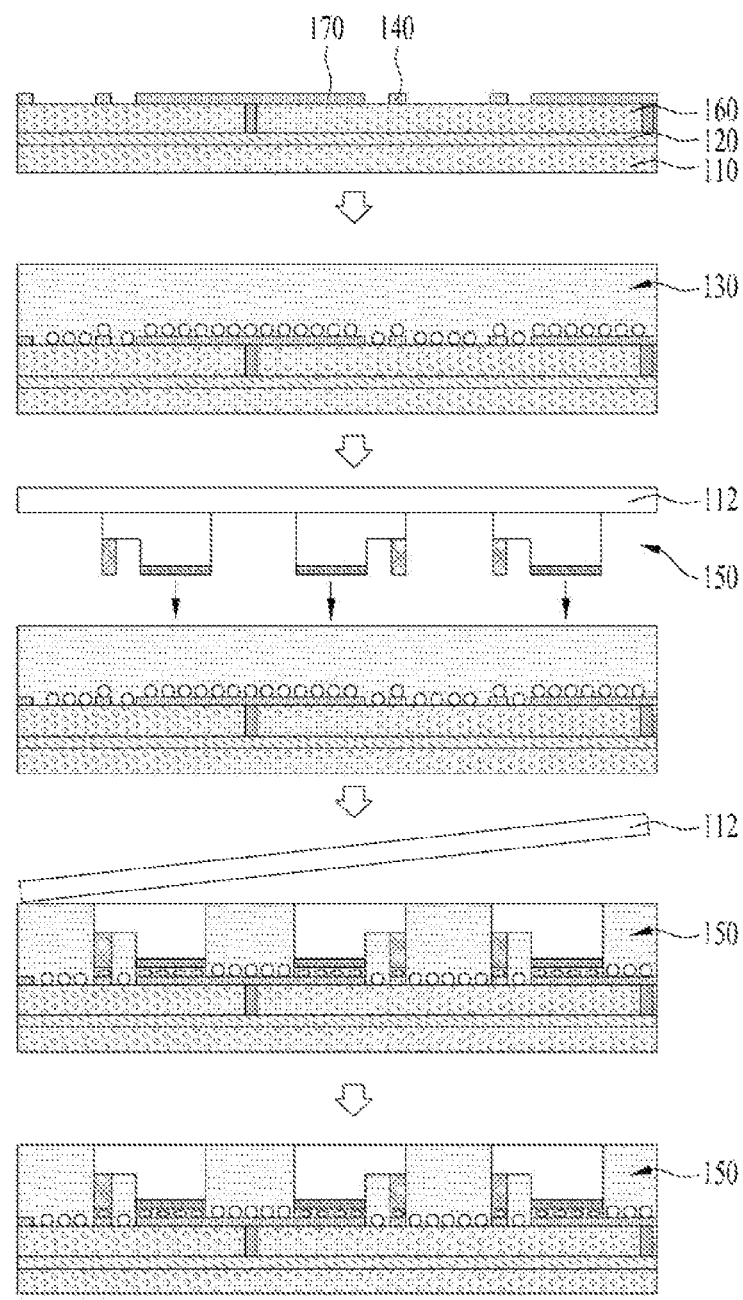
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
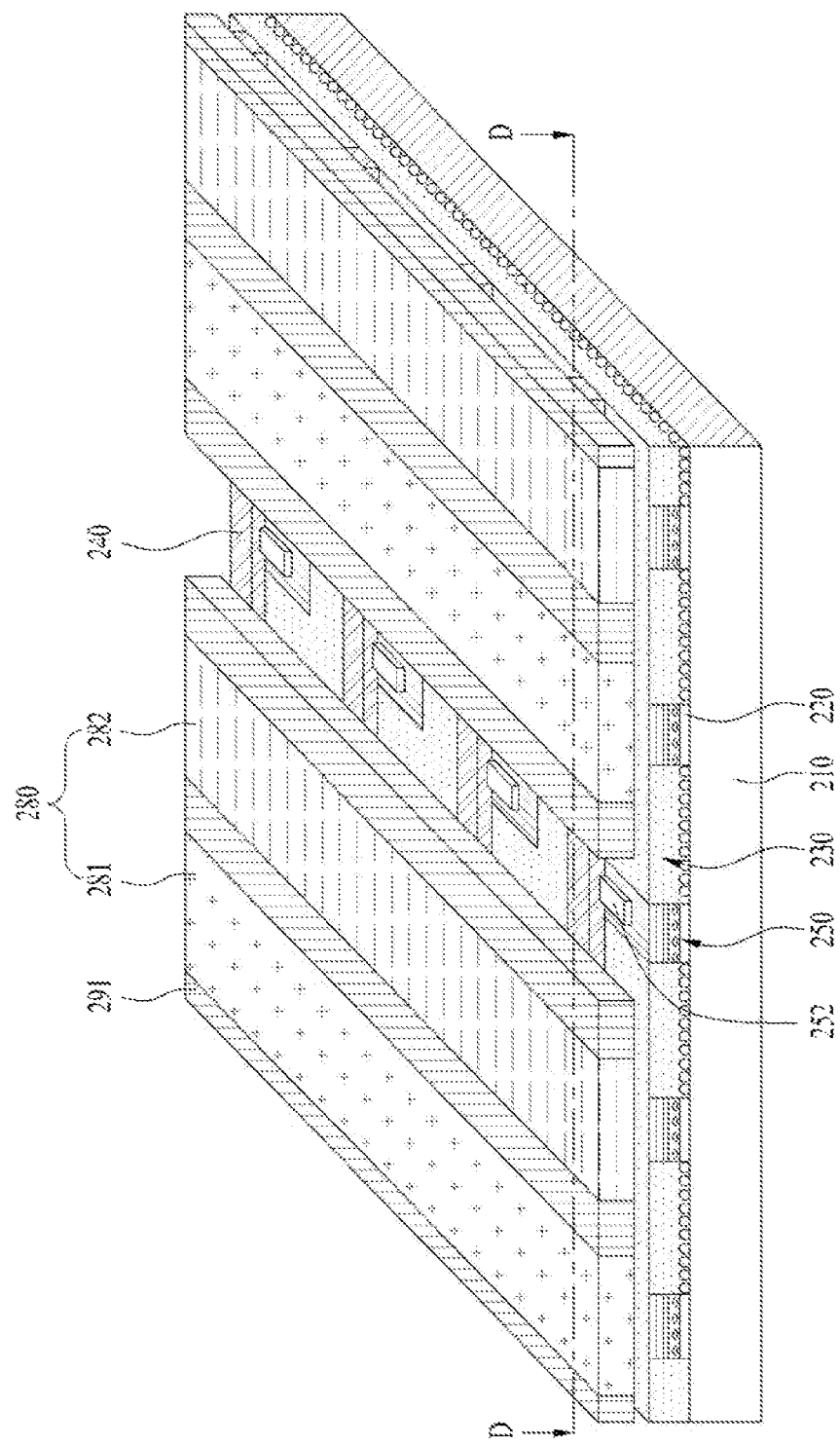
FIG. 7 is a perspective diagram of a display device using a semiconductor light emitting element according to another embodiment of the present disclosure.
Figure 8:
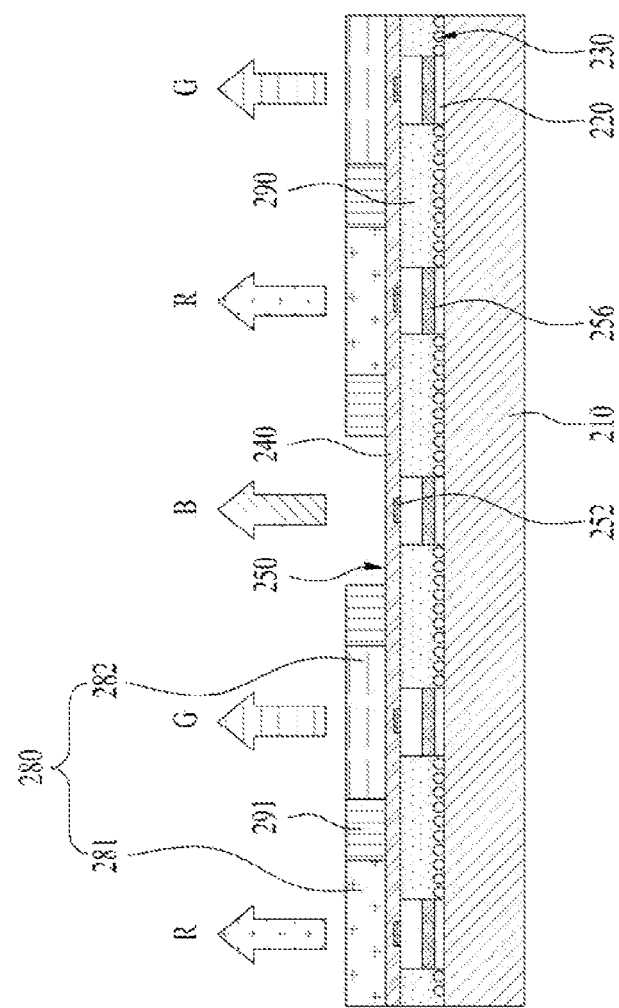
FIG. 8 is a cross-sectional diagram taken along a cutting line D-D shown in FIG. 8.
Figure 9:
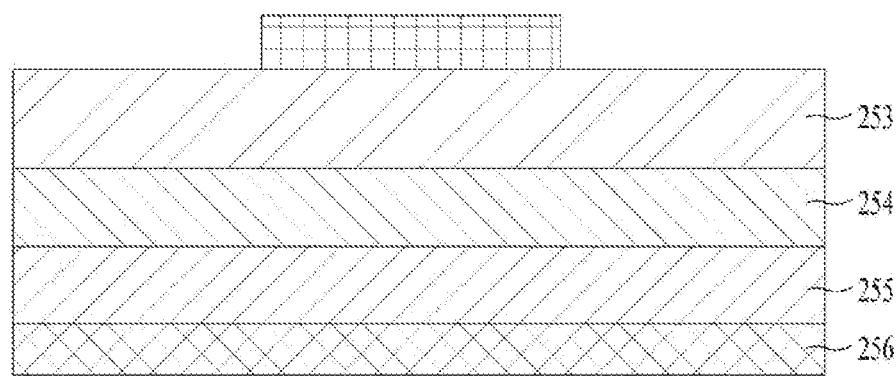
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm ×80 μm .

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
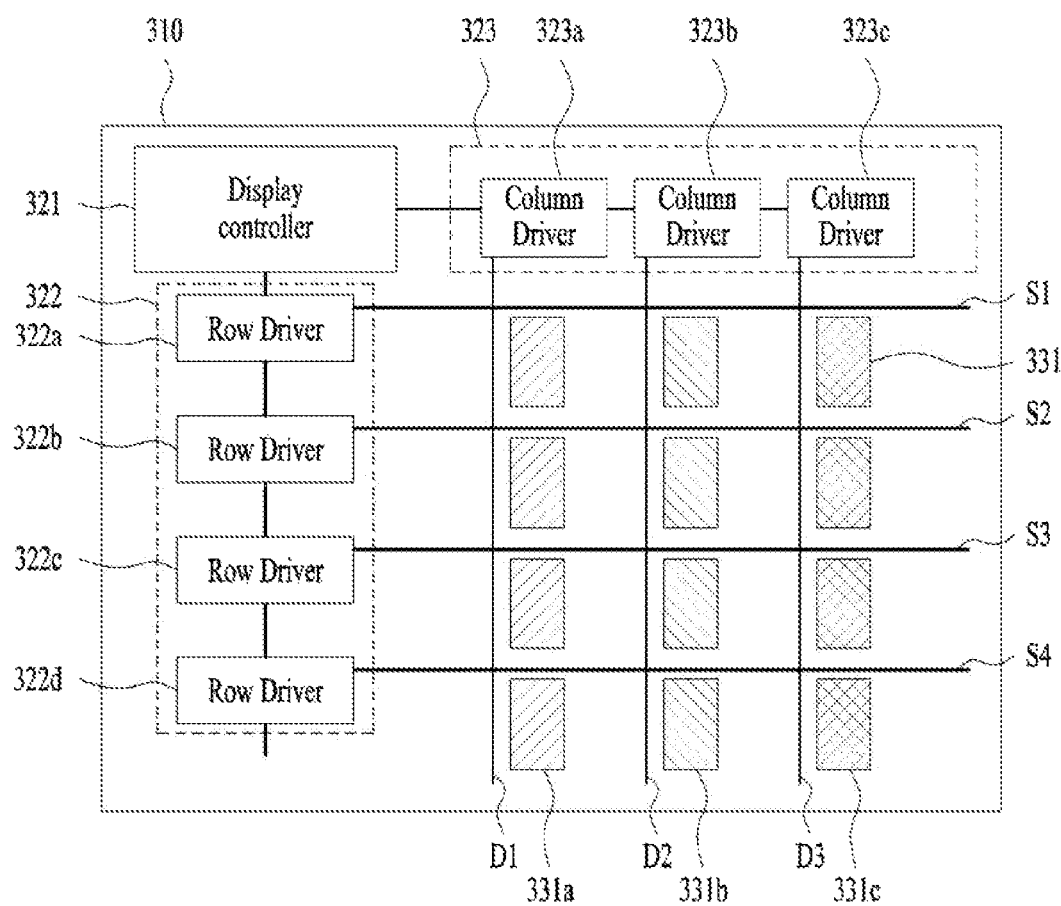
FIG. 10 is a schematic diagram for explaining a basic concept of driving a semiconductor light emitting element.

FIG. 10 is a schematic diagram for explaining a basic concept of driving a semiconductor light emitting element.

According to an embodiment, a display device using a semiconductor light emitting element may include a base substrate 310, a row driver 322 providing a first signal to a semiconductor light emitting element 331, a column driver 323 providing a second signal to the row driver 322 and the column driver 323, and a display controller 321 controlling signals provided to the row driver 322 and the column driver 323.

The base substrate 310 may correspond to the substrate 110 described with reference to FIG. 1. The row driver 322, the column driver, and the display controller 321 may be provided on the base substrate 310. In some cases, at least one of the column driver 323, the row driver, or the controller 321 may be provided on another substrate and connected to a wiring circuit provided on the base substrate 310.

The row driver 322 may be a component providing a scan signal to a row in which the semiconductor light emitting elements 331 are listed. Here, the scan signal may correspond to the first signal. A plurality of rows in which the semiconductor light emitting elements 331 are arranged may be provided on the base substrate 310. In this case, a plurality of row drivers 322a to 322d may be provided according to the number of rows. In some cases, the row driver 322 may be provided with fewer rows than the number of rows in which the semiconductor light emitting elements 331 are listed. In this regard, it will be described in detail in another embodiment.

The row driver 322 may be connected to row lines S1 to S4 extending in a row direction on the base substrate 310. The row driver 322 may provide the same signal to the semiconductor light emitting elements 331 connected along the row lines S1 to S4. For example, the first row driver 322 may be connected to a first row line S1 and may provide the same signal to the plurality of the semiconductor light emitting elements 331 connected along the first row line S1. Here, the plurality of row drivers 322a to 322d may sequentially provide signals to the rows of the semiconductor light emitting element 331.

The column driver 323 may be a component providing a data signal to a column in which the semiconductor light emitting elements 331 are listed. Here, the data signal may correspond to the second signal. A plurality of columns in which the semiconductor light emitting elements 331 are arranged may be provided on the base substrate 310. In this case, the plurality of column drivers 323a to 323c may be provided according to the number of columns. In some cases, the column driver 323 may be provided with fewer columns than the number of columns in which the semiconductor light emitting elements 331 are listed. In this regard, it will be described in detail in another embodiment.

The column driver 323 may be connected to column lines D1 to D3 extending in a column direction on the base substrate 310. The column driver 323 may provide the same signal to the semiconductor light emitting elements 331 connected along the column lines D1 to D3. For example, the first column driver 323a may be connected to a first column line D1, and may provide the same signal to the plurality of semiconductor light emitting elements 331 connected along the first column line D1. Here, the plurality of column drivers 323a to 323c may simultaneously provide signals to the columns of the semiconductor light emitting element 331.

The display controller 321 may control signals provided from the row driver 322 and the column driver 323. The display controller 321 may receive image data to be implemented through a display, and may control light emission of a matrix in which the semiconductor light emitting elements 331 are arranged during each frame in response to the image data. Here, the matrix in which the semiconductor light emitting elements 331 are arranged may mean a row and column arrangement formed by the plurality of the semiconductor light emitting elements 331.

The display controller 321 may control the first signal provided by the row driver 322 and the second signal provided by the column driver 323 during one frame, may configure a plurality of frames, and may implement the received image data on the matrix on which the semiconductor light emitting elements 331 are arranged.

The semiconductor light emitting element 331 may emit light in response to signals provided by the column driver 323 and the row driver 322. In detail, the semiconductor light emitting element 331 positioned at a point where signals of the column driver 323 and the row driver 322 intersect may emit light in response to a provided signal. For example, when a scan signal is provided from the first column driver 322a and a light emitting signal is provided from the first row driver 323a, the semiconductor light emitting element 331 positioned on a (1,1) matrix may emit light.

The semiconductor light emitting element 331 may include a semiconductor light emitting element 331a emitting blue light, a semiconductor light emitting element 331b emitting red light, and a semiconductor light emitting element 331c emitting green light.

The semiconductor light emitting element 331 may be a micro-LED having a size of tens or several microns. Here, the semiconductor light emitting element 331 may be a flip chip type semiconductor light emitting element described in FIG. 4 or a vertical semiconductor light emitting element described in FIG. 9.

One semiconductor light emitting element set 331 may be connected to one of the row lines S1 to S4 and one of the column line D1 to D3 to achieve passive matrix (PM) driving. Here, the PM driving connection may be a connection in which a first electrode and a second electrode of the semiconductor light emitting element 331 directly receive signals transmitted through one column line and one row line, respectively. Here, the first electrode may be a p-electrode, and the second electrode may be an n-type electrode. Alternatively, the first electrode may be an n-type electrode and the second electrode may be a p-type electrode.

As seen from the embodiment of FIG. 10, a plurality of rows formed by the plurality of row drivers 322a to 322d and the semiconductor light emitting elements 331 may be matched one-to-one. In addition, it can be seen that a plurality of columns formed by a plurality of column drivers 323a to 323d and the semiconductor light emitting elements 331 are matched one-to-one. Hereinafter, a circuit configuration for reducing the number of drivers will be described.

Figure 11:
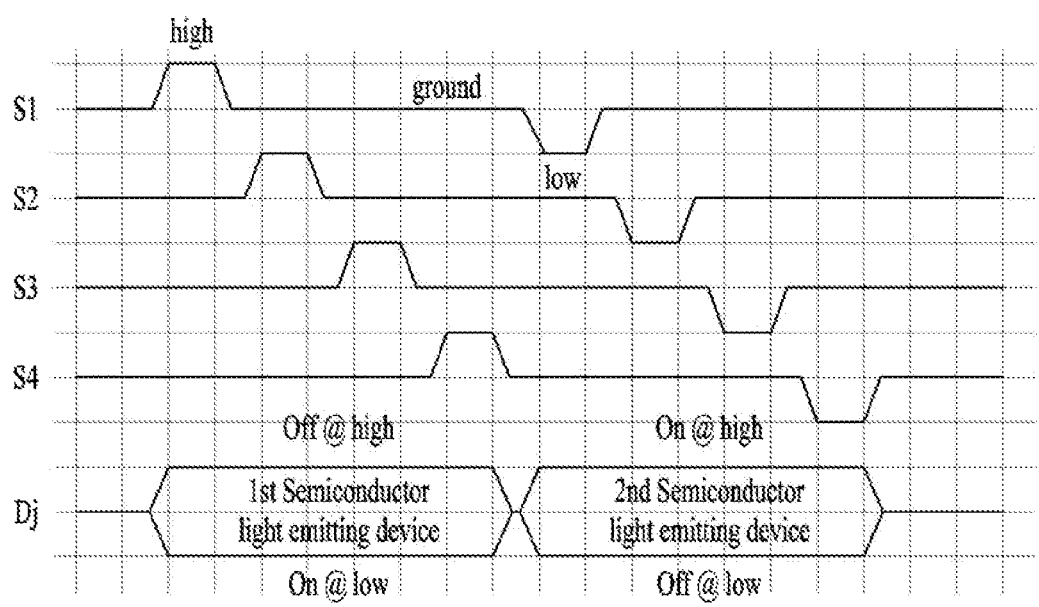
FIG. 11 shows signals provided by a row driver and a column driver according to an embodiment.

FIG. 11 shows signals provided by a row driver and a column driver according to an embodiment. For the same configuration, the description of FIG. 10 may be referred to.

According to an embodiment, a display device using a semiconductor light emitting element may include the base substrate 310, the row driver 322 providing a first signal to the semiconductor light emitting element 331, the column driver 323 providing a second signal to the semiconductor light emitting element 331, and the plurality of semiconductor light emitting elements 331 provided on the column driver 323 and the base substrate. In addition, the display device using a semiconductor light emitting element may include the display controller 321.

The row driver 322 may provide a 3-state first signal including high, ground, and low. Here, high may mean a signal with a higher potential than the ground, and low may mean a signal with a lower potential than the ground. Here, the ground signal means a reference signal and may be independent of the ground potential.

The column driver 323 may provide a 2-state second signal including high and low. Here, high may mean a signal with a higher potential than low. The high signal of the second signal may not be necessarily the same potential signal as the high signal of the first signal. Similarly, the low signal of the second signal may not be necessarily the same potential signal as the low signal of the first signal.

The semiconductor light emitting element 331 may include a first semiconductor light emitting element 3311 (refer to FIG. 12) and a second semiconductor light emitting element 3312 (refer to FIG. 12) connected to the row driver 322 and the column driver 323 in different polar directions.

The first semiconductor light emitting element 3311 may be configured in such a way that a first electrode is connected to the row driver 322 and a second electrode is connected to the column driver 323. The first semiconductor light emitting element 3311 may be formed in a polar direction to emit light when a first high signal is input to the first electrode and a second low signal is input to the second electrode. With regard to the first semiconductor light emitting element 3311, when a first ground signal or a first low signal is input to the first electrode, and a second high or low signal is input to the second electrode, a potential difference insufficient to emit light from the first light emitting element 3311 may be formed, or a potential difference may be generated in an opposite direction to the polar direction, and thus the first semiconductor light emitting element 3311 may not emit light.

The second semiconductor light emitting element 3312 may be configured in such a way that a first electrode is connected to the column driver 323 and a second electrode is connected to the row driver 322. The second semiconductor light emitting element 3312 may be formed in a polar direction to emit light when a first low signal is input to the first electrode and a second high signal is input to the second electrode. With regard to the second semiconductor light emitting element 3312, when a first high signal or a first ground signal is input to the first electrode, and a second high or low signal is input to the second electrode, a potential difference insufficient to emit light from the second semiconductor light emitting element 3312 may be formed, or a potential difference may be generated in an opposite direction to the polar direction, and thus the second semiconductor light emitting element 3312 may not emit light.

Hereinafter, an arrangement structure of the first semiconductor light emitting element 3311 and the second semiconductor light emitting element 3312 will be described.

Figure 12:
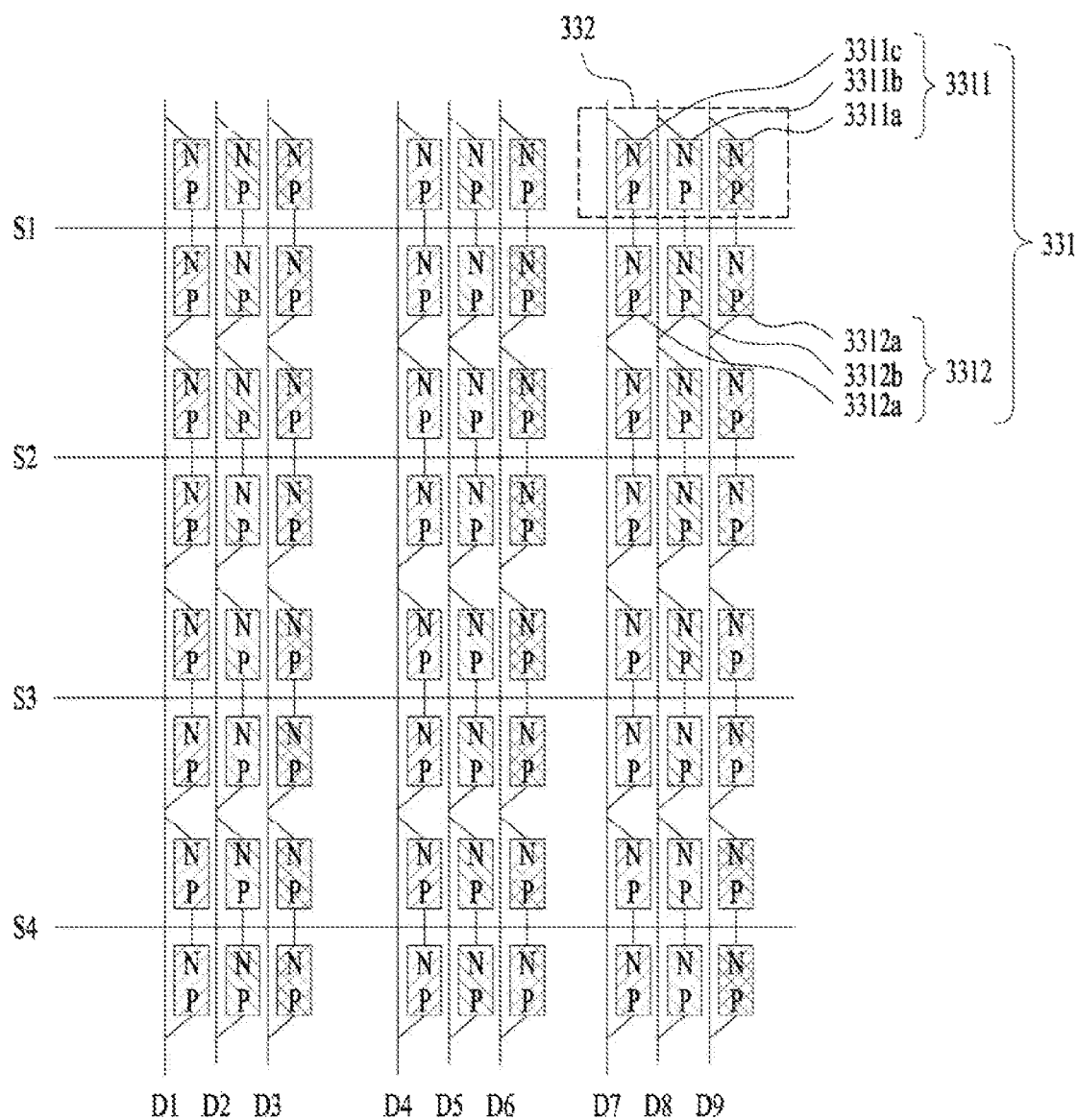
FIG. 12 is a schematic diagram for explaining an arrangement structure of a first semiconductor light emitting element and a second semiconductor light emitting element according to an embodiment.

FIG. 12 is a schematic diagram for explaining the arrangement structure of the first semiconductor light emitting element 3311 and the second semiconductor light emitting element 3312 according to an embodiment. Hereinafter, for the same configuration, the description of FIGS. 10 and 11 may be referred to.

According to an embodiment, a display device using a semiconductor light emitting element may include the base substrate 310, the row driver 322 providing a first signal to the semiconductor light emitting element 331, the column driver 323 providing a second signal to the semiconductor light emitting element 331, and the plurality of semiconductor light emitting elements 331 provided on the column driver 323 and the base substrate. In addition, the display device using a semiconductor light emitting element may include the display controller 321.

The semiconductor light emitting element 331 may include the first semiconductor light emitting element 3311 and the second semiconductor light emitting element 3312 connected to the row driver 322 and the column driver 323 in different polar directions.

A display device using a semiconductor light emitting element according to an embodiment may include the first semiconductor light emitting element 3311 and the second semiconductor light emitting element that cross each other in a column direction. Here, when the first semiconductor light emitting element 3311 and the second semiconductor light emitting element cross each other, this means the state in which the first semiconductor light emitting element 3311 and the second semiconductor light emitting element 3312 that are connected to the same row line (one of S1 to S4) and the same column line (one of D1 to D9) are arranged in a column direction.

In this case, the display device using the semiconductor light emitting element may include the row drivers 322 in a number corresponding to half the number of rows formed by the plurality of semiconductor light emitting elements. For example, when the semiconductor light emitting elements 331 are arranged in eight rows, a first signal may be provided to all semiconductor light emitting elements with only four row drivers 322.

Here, the first semiconductor light emitting element 3311 may be provided in a set, and may include a semiconductor light emitting element 3311a emitting blue light, a semiconductor light emitting element 3311b emitting red light, and a semiconductor light emitting element 3311c emitting green light. One set of the first semiconductor light emitting elements 3311 may correspond to one pixel 332.

Similarly, the second semiconductor light emitting element 3312 may be provided in a set, and may include a semiconductor light emitting element 3312a emitting red light, a semiconductor light emitting element 3312b emitting red light, and a semiconductor light emitting element 3312c emitting green light. One set of the second semiconductor light emitting elements 3312 may correspond to one pixel.

Figure 13:
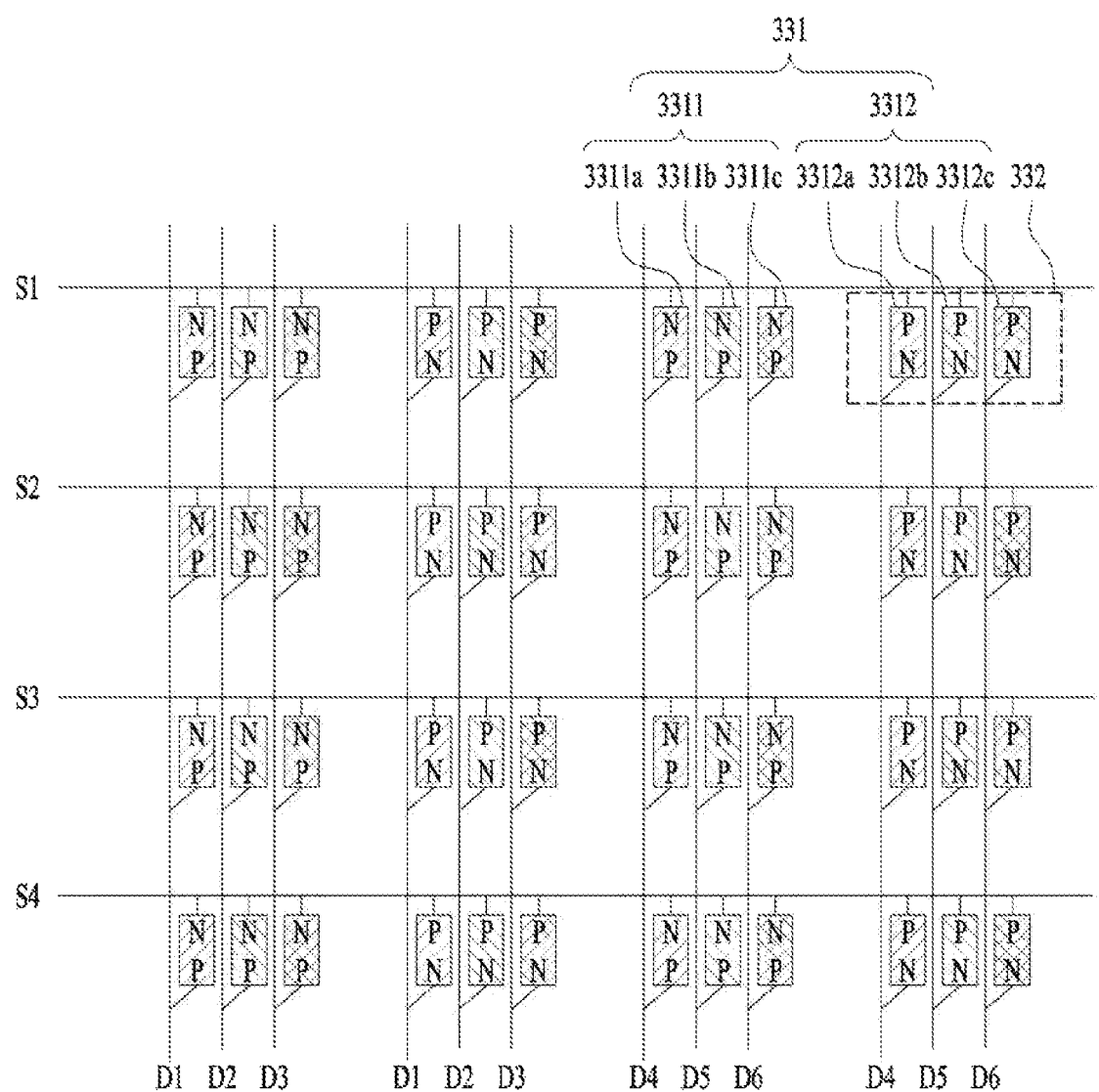
FIG. 13 is a schematic diagram for explaining an arrangement structure of a first semiconductor light emitting element and a second semiconductor light emitting element according to another embodiment.

FIG. 13 is a schematic diagram for explaining the arrangement structure of the first semiconductor light emitting element 3311 and the second semiconductor light emitting element 3312 according to another embodiment. Hereinafter, for the same configuration, the description of FIGS. 10 and 11 may be referred to.

According to another embodiment, a display device using a semiconductor light emitting element may include the base substrate 310, the row driver 322 providing a first signal to the semiconductor light emitting element 331, the column driver 323 providing a second signal to the semiconductor light emitting element 331, and the plurality of semiconductor light emitting elements 331 provided on the column driver 323 and the base substrate. In addition, the display device using a semiconductor light emitting element may include the display controller 321.

The semiconductor light emitting element 331 may include the first semiconductor light emitting element 3311 and the second semiconductor light emitting element 3312 connected to the row driver 322 and the column driver 323 in different polar directions.

A display device using a semiconductor light emitting element according to another embodiment may include the first semiconductor light emitting element 3311 and the second semiconductor light emitting element that cross each other in a row direction. Here, when the first semiconductor light emitting element 3311 and the second semiconductor light emitting element cross each other, this means the state in which the first semiconductor light emitting element 3311 and the second semiconductor light emitting element 3312 that are connected to the same row line (one of S1 to S4) and the same column line (one of D1 to D9) are arranged in a row direction.

In this case, the display device using the semiconductor light emitting element may include the column drivers 323 in a number corresponding to half the number of columns formed by the plurality of semiconductor light emitting elements. For example, when the semiconductor light emitting elements 331 are arranged in 12 columns, a second signal may be provided to all semiconductor light emitting elements with only six column drivers 323.

Here, the first semiconductor light emitting element 3311 may be provided in a set, and may include a semiconductor light emitting element 3311a emitting blue light, a semiconductor light emitting element 3311b emitting red light, and a semiconductor light emitting element 3311c emitting green light. One set of the first semiconductor light emitting elements 3311 may correspond to one pixel.

Similarly, the second semiconductor light emitting element 3312 may be provided in a set, and may include a semiconductor light emitting element 3312a emitting red light, a semiconductor light emitting element 3312b emitting red light, and a semiconductor light emitting element 3312c emitting green light. One set of the second semiconductor light emitting elements 3312 may correspond to one pixel 332.

Hereinafter, a display including an interposer 330 as a unit module will be described.

Figure 14:
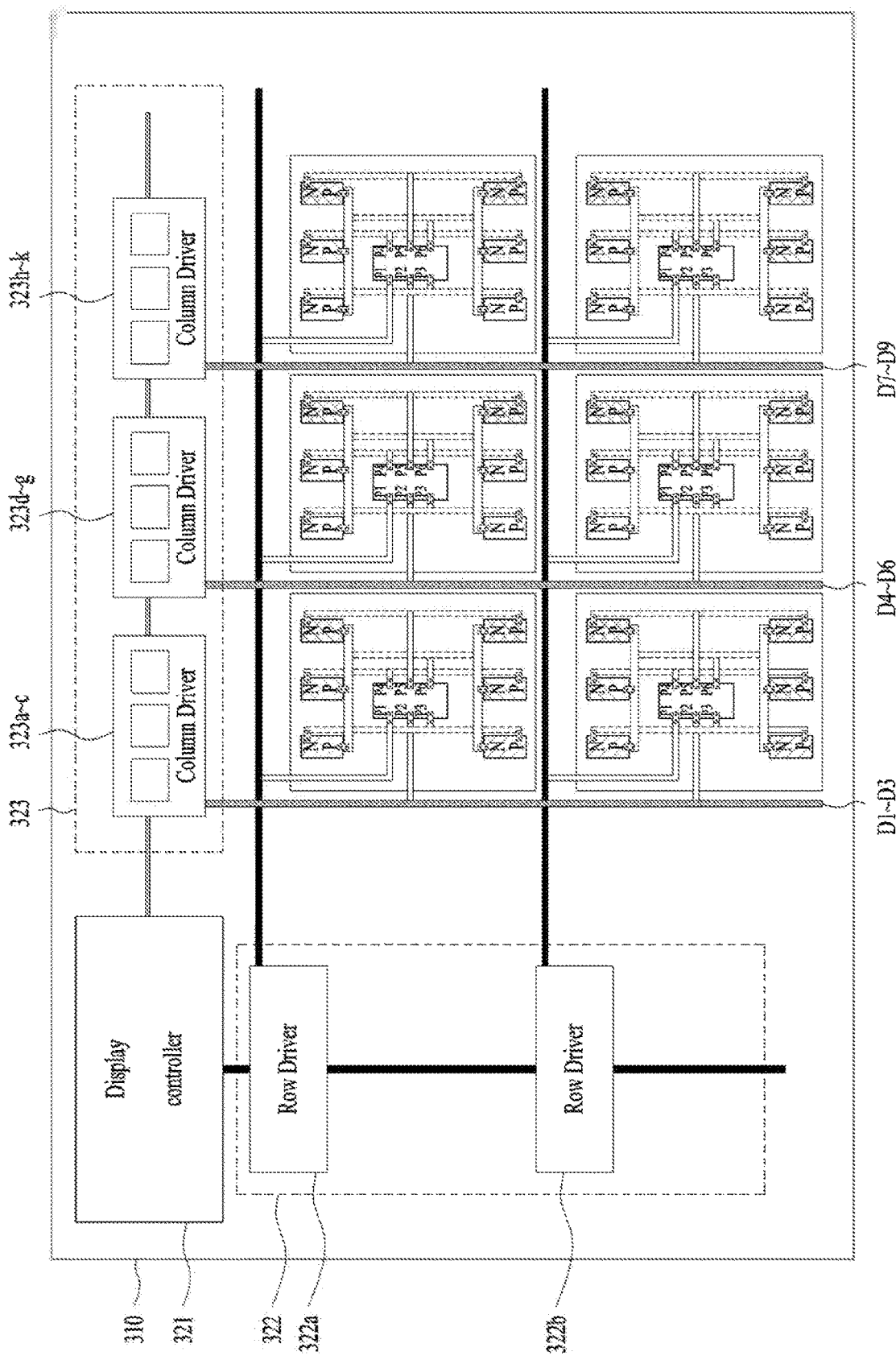
FIG. 14 is a schematic diagram for explaining a display device including an interposer as a unit module according to an embodiment.
Figure 15:
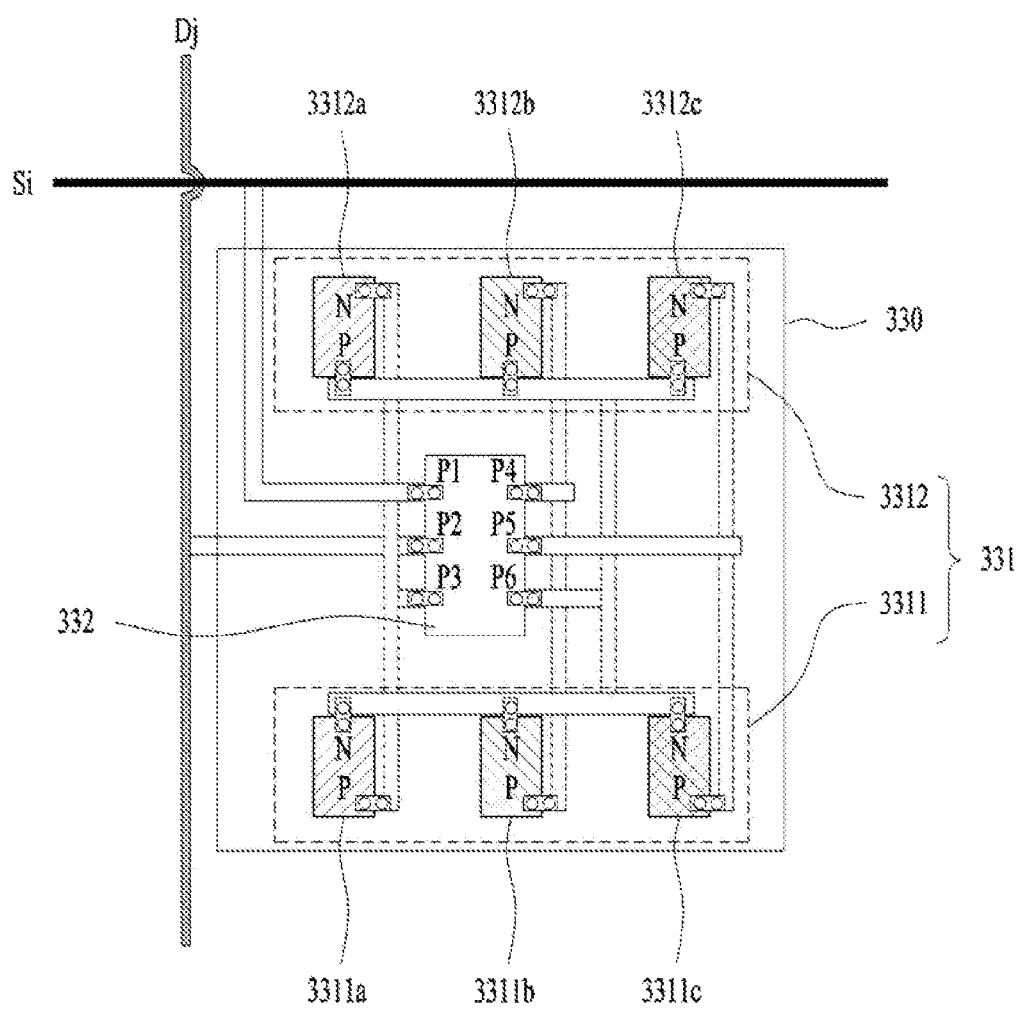
FIG. 15 is an enlarged view of a unit-module interposer.

FIG. 14 is a schematic diagram for explaining a display device including the interposer 330 as a unit module according to an embodiment. FIG. 15 is an enlarged view of the unit-module interposer 330. Hereinafter, for the same configuration, the description of FIGS. 10 and 11 may be referred to. In detail, FIG. 14 may correspond to the embodiment of FIG. 12.

The display device using the semiconductor light emitting element may include the base substrate 310, the row driver 322 providing a first signal to the semiconductor light emitting element 331, the column driver 323 providing a second signal to the semiconductor light emitting element 331, and the plurality of semiconductor light emitting elements 331 provided on the column driver 323 and the base substrate. In addition, the display device using the semiconductor light emitting element may include the display controller 321.

The semiconductor light emitting element 331 may include the first semiconductor light emitting element 3311 and the second semiconductor light emitting element 3312 connected to the row driver 322 and the column driver 323 in different polar directions.

The display device using the semiconductor light emitting element may include the first semiconductor light emitting element 3311, the second semiconductor light emitting element 3312, and the unit-module interposer 330 including an IC chip 332.

The interposer 330 may include a set of the first semiconductor light emitting elements 3311 and a set of the second semiconductor light emitting elements 3312 to correspond to at least two pixels and may include one IC chip 332.

The IC chip 332 may be electrically connected to a row line Si and a column line Dj included in the base substrate 310 in the state in which the interposer 330 is coupled to the base substrate 310.

The IC chip 332 may include a pin P1 connected to the row line Si, a pin P2 connected to a column line Di, a pin P3 providing a second signal to the semiconductor light emitting elements 3311a and 3312 emitting blue light, a pin P4 providing a second signal to the semiconductor light emitting elements 3311b and 3312b emitting red light, a pin P5 providing a second signal to the semiconductor light emitting elements 3311c and 3312c emitting green light, and a pin P6 providing a first signal to the semiconductor light emitting element 331.

In detail, in the first semiconductor light emitting element 3311, the first electrode may be connected to P6, and the second electrode may be connected to each of P3 to P5. In the second semiconductor light emitting element 3312, the first electrode may be connected to each of P3 to P5, and the second electrode may be connected to P6.

Figure 16:
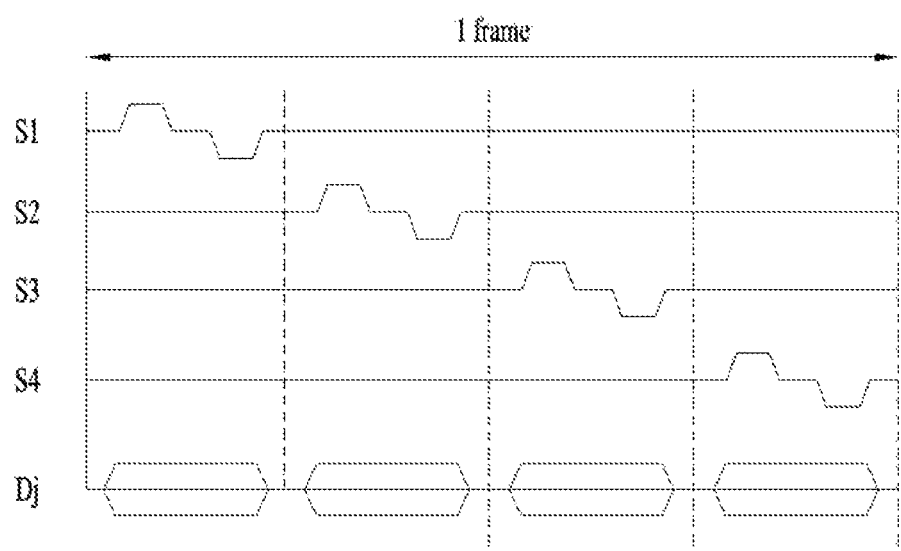
FIG. 16 is a conceptual diagram for explaining a signal pattern provided by a row driver and a column driver according to an embodiment.

FIG. 16 is a conceptual diagram for explaining a signal pattern provided by a row driver and a column driver according to an embodiment. Hereinafter, for the same configuration, the description of FIGS. 10 and 11 may be referred to.

According to another embodiment, a display device using a semiconductor light emitting element may include the base substrate 310, the row driver 322 providing a first signal to the semiconductor light emitting element 331, the column driver 323 providing a second signal to the semiconductor light emitting element 331, and the plurality of semiconductor light emitting elements 331 provided on the column driver 323 and the base substrate. In addition, the display device using a semiconductor light emitting element may include the display controller 321.

The row driver 322 may provide a 3-state first signal including high, ground, and low. Here, high may mean a signal with a higher potential than the ground, and low may mean a signal with a lower potential than the ground. Here, the ground signal means a reference signal and may be independent of the ground potential.

The column driver 323 may provide a 2-state second signal including high and low. Here, high may mean a signal with a higher potential than low. The high signal of the second signal may not be necessarily the same potential signal as the high signal of the first signal. Similarly, the low signal of the second signal may not be necessarily the same potential signal as the low signal of the first signal.

The row driver 322 may sequentially provide high, ground, and low signals. Here, when the signals are sequentially provided, this means that high, ground, and low signals are provided to one row line Si, and high, ground, and low signals are provided to a next row line Si+1.

In this case, the signal provided by the column driver 323 may be provided for a longer period of time, and thus it may be possible to provide a stable signal.

Figure 17:
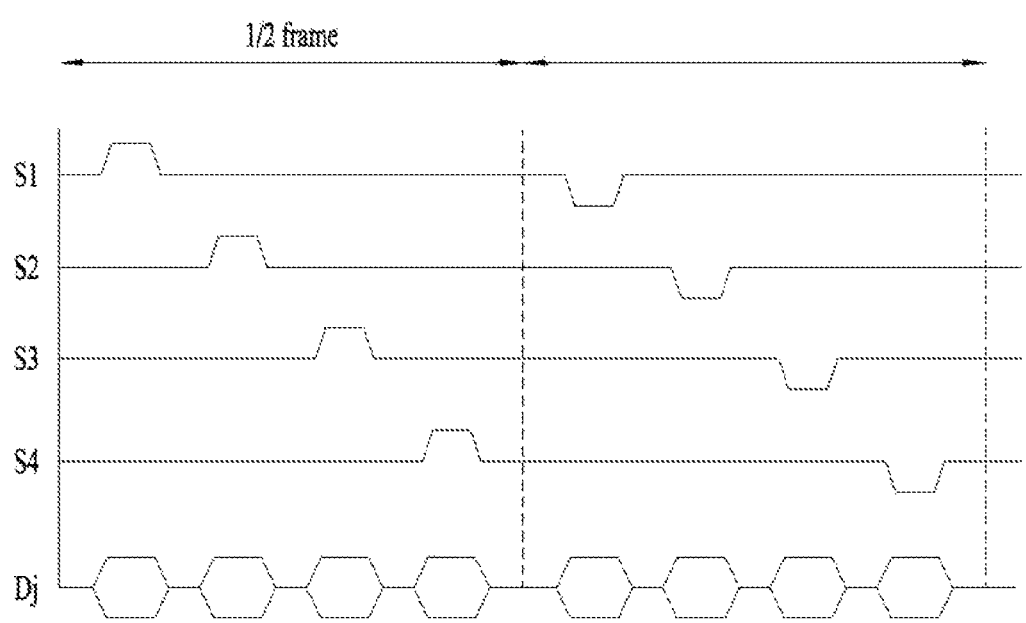
FIG. 17 is a conceptual diagram for explaining a signal pattern provided by a row driver and a column driver according to another embodiment.

FIG. 17 is a conceptual diagram for explaining a signal pattern provided by a row driver and a column driver according to another embodiment. Hereinafter, for the same configuration, the description of FIGS. 10 and 11 may be referred to.

According to an embodiment, a display device using a semiconductor light emitting element may include the base substrate 310, the row driver 322 providing a first signal to the semiconductor light emitting element 331, the column driver 323 providing a second signal to the semiconductor light emitting element 331, and the plurality of semiconductor light emitting elements 331 provided on the column driver 323 and the base substrate. In addition, the display device using a semiconductor light emitting element may include the display controller 321.

The row driver 322 may provide a 3-state first signal including high, ground, and low. Here, high may mean a signal with a higher potential than the ground, and low may mean a signal with a lower potential than the ground. Here, the ground signal means a reference signal and may be independent of the ground potential.

The column driver 323 may provide a 2-state second signal including high and low. Here, high may mean a signal with a higher potential than low. The high signal of the second signal may not be necessarily the same potential signal as the high signal of the first signal. Similarly, the low signal of the second signal may not be necessarily the same potential signal as the low signal of the first signal.

The row driver 322 may provide a high signal in a first ½ frame and a low signal in a next ½ frame, or provide signals in a reverse order.

In this case, the signal provided by the row driver 322 may be more discriminated and a stable signal may be provided.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A display device comprising:
a base substrate;
a row driver configured to provide a first signal in one of a first high state, a ground state, or a first low state;
a column driver configured to provide a second signal in one of a second high state or a second low state; and
a plurality of semiconductor light emitting devices located on the base substrate,
wherein the plurality of semiconductor light emitting device include a first semiconductor light emitting device and a second semiconductor light emitting device that are connected to the row driver and the column driver in different polar directions.

2. The display device of claim 1, wherein a first electrode of the first semiconductor light emitting device is connected to the row driver and a second electrode of the first semiconductor light emitting device is connected to the column driver, and
wherein a first electrode of the second semiconductor light emitting device is connected to the column driver and a second electrode of the second semiconductor light emitting device is connected to the row driver.

3. The display device of claim 1, wherein the first semiconductor light emitting device emits light based on the first signal being in the first high state and the second signal being in the second low state, and
wherein the second semiconductor light emitting device emits light based on the first signal being in the first low state and the second signal being in the second high state.

4. The display device of claim 1, wherein the first semiconductor light emitting device and the second semiconductor light emitting device cross each other in a column direction.

5. The display device of claim 4, wherein the display device further comprises a plurality of row drivers including the row driver, in a number corresponding to half a number of rows formed by the plurality of semiconductor light emitting devices.

6. The display device of claim 1, wherein the first semiconductor light emitting device and the second semiconductor light emitting device cross each other in a row direction.

7. The display device of claim 6, wherein the display device further comprises a plurality of row drivers including the row driver, in a number corresponding to half a number of columns formed by the plurality of semiconductor light emitting devices.

8. The display device of claim 1, wherein the display device further comprises a unit-module interposer including the first semiconductor light emitting device, the second semiconductor light emitting device, and an integrated circuit (IC) chip.

9. The display device of claim 8, wherein the base substrate includes a row line connected to the row driver and a column line connected to the column driver, and
wherein the unit-module interposer is disposed on the base substrate to electrically connect the row line and the column line to the IC chip.

10. The display device of claim 8, wherein the IC chip includes:
a first pin configured to provide a signal to the row driver; and
a second pin configured to provide a signal to the column driver,
wherein a first electrode of the first semiconductor light emitting device is connected to the first pin and a second electrode of the first semiconductor light emitting device is connected to the second pin, and
wherein a first electrode of the second semiconductor light emitting device is connected to the second pin and a second electrode of the second semiconductor light emitting device is connected to the first pin.

11. The display device of claim 8, wherein the unit-module interposer includes a first semiconductor light emitting device set including a plurality of first semiconductor light emitting devices including the first semiconductor light emitting device, and a second semiconductor light emitting device set including a plurality of second semiconductor light emitting devices including the second semiconductor light emitting device.

12. The display device of claim 11, wherein the first semiconductor light emitting device and the second semiconductor light emitting device each includes semiconductor light emitting devices that emit red light, green light, and blue light, respectively.

13. The display device of claim 1, wherein the display device is configured to perform passive matrix (PM) driving.

14. The display device of claim 1, wherein the row driver is further configured to sequentially provide the first signal in the first high state, the first signal in the ground state, and the first signal in the first low state.

15. The display device of claim 1, wherein the row driver is configured to:
provide the first signal in the first high state in a first ½ frame and the first signal in the first low state in a next ½ frame, or
provide the first signal in the first low state in the first ½ frame and the first signal in the first high state in the next ½ frame.

16. A display device comprising:
a base substrate;
a row driver configured to provide a first signal in one of a first high state, a ground state, or a first low state;
a column driver configured to provide a second signal in one of a second high state or a second low state;
a plurality of semiconductor light emitting devices located on the base substrate; and
a unit-module interposer including a first semiconductor light emitting device of the plurality of semiconductor light emitting devices, a second semiconductor light emitting device of the plurality of semiconductor light emitting devices, and an integrated circuit (IC) chip including the row driver and the column driver,
wherein the first semiconductor light emitting device and the second semiconductor light emitting device are connected to the row driver and the column driver in different polar directions.

17. The display device of claim 16, wherein the base substrate includes a row line connected to the row driver and a column line connected to the column driver, and
wherein the unit-module interposer is disposed on the base substrate to electrically connect the row line and the column line to the IC chip.

18. The display device of claim 16, wherein a first electrode of the first semiconductor light emitting device is connected to the row driver and a second electrode of the first semiconductor light emitting device is connected to the column driver, and wherein a first electrode of the second semiconductor light emitting device is connected to the column driver and a second electrode of the second semiconductor light emitting device is connected to the row driver.

19. The display device of claim 16, wherein the first semiconductor light emitting device emits light based on the first signal being in the first high state and the second signal being in the second low state, and wherein the second semiconductor light emitting device emits light based on the first signal being in the first low state and the second signal being in the second high state.

20. The display device of claim 16, wherein the display device further comprises a plurality of row drivers including the row driver, in a number corresponding to half a number of columns formed by the plurality of semiconductor light emitting devices.

\* \* \* \* \*